(12) United States Patent
Song

(10) Patent No.: US 11,145,699 B2
(45) Date of Patent: Oct. 12, 2021

(54) PIXEL DEFINE STRUCTURE, DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventor: Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/494,516

(22) PCT Filed: Mar. 19, 2019

(86) PCT No.: PCT/CN2019/078722
§ 371 (c)(1),
(2) Date: Sep. 16, 2019

(87) PCT Pub. No.: WO2020/007066
PCT Pub. Date: Jan. 9, 2020

(65) Prior Publication Data
US 2020/0295101 A1 Sep. 17, 2020

(30) Foreign Application Priority Data
Jul. 2, 2018 (CN) .......................... 201810719283.3

(51) Int. Cl.
*H01L 27/32* (2006.01)
*B41M 5/00* (2006.01)

(52) U.S. Cl.
CPC ....... *H01L 27/3246* (2013.01); *B41M 5/0047* (2013.01)

(58) Field of Classification Search
CPC combination set(s) only.
See application file for complete search history.

(56) References Cited

U.S. PATENT DOCUMENTS

2007/0072322 A1 3/2007 Chang
2016/0056218 A1* 2/2016 Wang .................. H01L 51/0004
257/40
(Continued)

FOREIGN PATENT DOCUMENTS

CN 104241329 A 12/2014
CN 105826355 A 8/2016
(Continued)

OTHER PUBLICATIONS

First Office Action for CN Appl. No. 201810719283.3, dated Mar. 4, 2020.

*Primary Examiner* — Nduka E Ojeh
(74) *Attorney, Agent, or Firm* — The Webb Law Firm

(57) ABSTRACT

The present disclosure provides a pixel define structure, a display panel and a method for manufacturing the same, and a display device, relating to the technical field of display. The pixel define structure includes a pixel define layer including a lyophobic material on a substrate, wherein the pixel define layer includes a stacked multilayer including at least a first layer and a second layer, the first layer being located between the substrate and the second layer, wherein a mass percent of the lyophobic material in the second layer is greater than a mass percent of the lyophobic material in the first layer.

20 Claims, 3 Drawing Sheets

(56) References Cited

U.S. PATENT DOCUMENTS

2016/0155784 A1    6/2016  Park et al.
2018/0197927 A1*  7/2018  Tan ..................... H01L 27/1251
2019/0305058 A1* 10/2019  Hou ..................... H01L 51/0005

FOREIGN PATENT DOCUMENTS

| | | |
|---|---|---|
| CN | 106941112 A | 7/2017 |
| CN | 107093681 A | 8/2017 |
| CN | 107845661 A | 3/2018 |
| CN | 108899345 A | 11/2018 |

* cited by examiner

PIXEL DEFINE STRUCTURE, DISPLAY PANEL AND METHOD FOR MANUFACTURING THE SAME, AND DISPLAY DEVICE

CROSS-REFERENCE TO RELATED APPLICATIONS

The present application is a U.S. National Stage Application under 35 U.S.C. § 371 of International Patent Application No. PCT/CN2019/078722, filed on Mar. 19, 2019, which claims priority to China Patent Application No. 201810719283.3 filed on Jul. 2, 2018, the disclosures of both of which are incorporated by reference herein in their entirety.

TECHNICAL FIELD

The present disclosure relates to the technical field of display, and especially to a pixel define structure, a display panel and a method for manufacturing the same, and a display device.

BACKGROUND

In recent years, organic light-emitting diode (OLED) display panel has attracted more and more attention due to its active luminescence, high luminance, bright color, wide viewing angle and fast response speed.

After the pixel define layer (PDL) is formed, a luminescent material of the OLED is formed in an opening of the pixel define layer. At present, in order to achieve mass production of OLED, the inkjet printing technology with a high material utilization rate is generally used to form the luminescent material.

SUMMARY

According to an aspect of an embodiment of the present disclosure, a pixel define structure is provided. The pixel define structure comprises: a pixel define layer comprising a lyophobic material on a substrate, wherein the pixel define layer comprises a stacked multilayer comprising at least a first layer and a second layer, the first layer being located between the substrate and the second layer, and wherein a mass percent of the lyophobic material in the second layer is greater than a mass percent of the lyophobic material in the first layer.

In some embodiments, the mass percent of the lyophobic material in each of the stacked multilayer increases gradually in a direction from the substrate to the pixel define layer.

In some embodiments, the pixel define layer further comprises at least one of polyimide or polymethyl methacrylate other than the lyophobic material.

In some embodiments, the pixel define layer is in a shape of mesh.

In some embodiments, a projection of the second layer on the substrate is within a projection of the first layer on the substrate.

In some embodiments, the pixel define layer has a thickness ranging from 0.5 micron to 5 microns.

In some embodiments, the stacked multilayer comprises 3 layers to 6 layers.

In some embodiments, the lyophobic material comprises at least one of fluorinated polymeric material or chlorinated polymeric material.

According to another aspect of an embodiment of the present disclosure, a display panel is provided. The display panel comprises the pixel define structure according to any of the above embodiments.

In some embodiments, the display panel further comprises: the substrate; and an electrode disposed on the substrate, wherein the pixel define layer defines an opening exposing at least a part of an upper surface of the electrode.

According to still another aspect of an embodiment of the present disclosure, a display device is provided. The display device comprises the display panel according to any of the above embodiments.

According to yet still another aspect of an embodiment of the present disclosure, a method for manufacturing a display panel is provided. The method comprises: providing a substrate; forming a patterned mask layer on the substrate; forming a pixel define layer comprising a lyophobic material on a region of the substrate where the patterned mask layer is not formed, wherein the pixel define layer comprises a stacked multilayer comprising at least a first layer and a second layer, the first layer being located between the substrate and the second layer, wherein a mass percent of the lyophobic material in the second layer is greater than a mass percent of the lyophobic material in the first layer; and removing the patterned mask layer.

In some embodiments, the pixel define layer is formed by an ink jet printing process.

In some embodiments, forming the pixel define layer by the ink jet printing process comprises: printing a first solution containing the lyophobic material on the region of the substrate to form the first layer; and printing a second solution containing the lyophobic material on the first layer to form the second layer, wherein the mass percent of the lyophobic material in the second solution is greater than the mass percent of the lyophobic material in the first solution.

In some embodiments, forming the pixel define layer by the ink jet printing process comprises: printing sequentially a plurality of solutions comprising the first solution and the second solution on the region of the substrate to form the stacked multilayer, wherein the earlier one of the plurality of solutions is printed, the lower the mass percent of the lyophobic material in the one of the plurality of solutions is.

In some embodiments, a mass ratio of the lyophobic material to a solute material in each of the plurality of solutions is less than or equal to 1.

In some embodiments, the method further comprises: forming, before forming the patterned mask layer, an electrode on the substrate, wherein the patterned mask layer covers at least a part of an upper surface of the electrode.

In some embodiments, the method further comprises: printing, after removing the patterned mask layer, a luminescent material in an opening of the pixel define layer.

In some embodiments, forming the patterned mask layer on the substrate comprises: forming a photoresist layer on the substrate; and exposing and developing the photoresist layer to form the patterned mask layer.

In some embodiments, the stacked multilayer comprises 3 layers to 6 layers.

In some embodiments, the lyophobic material comprises at least one of fluorinated polymeric material or chlorinated polymeric material.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

It should be understood that the dimensions of the parts shown in the drawings are not drawn according to the actual scale. In addition, the same or similar reference numerals denote the same or similar components.

DETAILED DESCRIPTION

Figure 1:
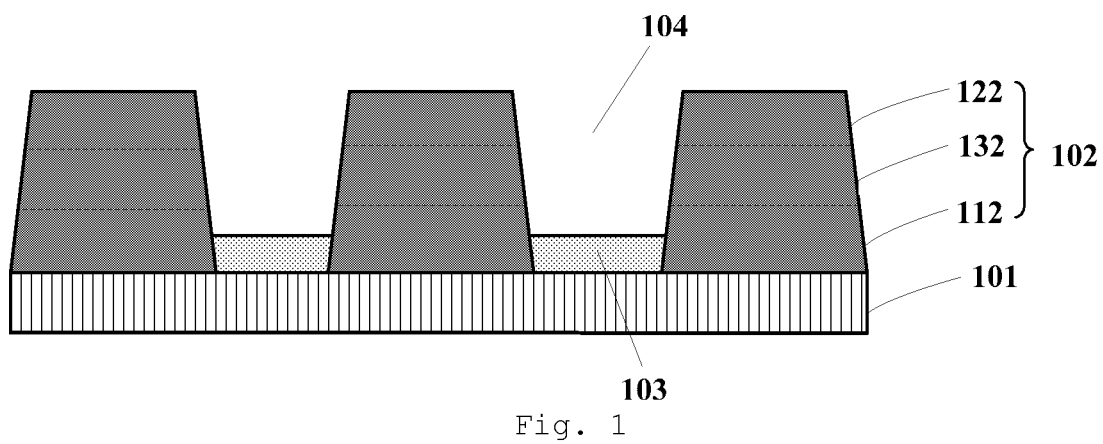
FIG. 1 is a schematic structural view showing a pixel define structure according to an embodiment of the present disclosure.

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noted that when the luminescent material is printed in the opening formed in the pixel define layer, the thickness of the formed luminescent material is non-uniform, which causes non-uniform light emission of the OLED, thereby affecting the display effect of the OLED display panel.

After studying the above problems, the inventors have found that, after curing the pixel define layer, the lyophobicity of the upper surface of the pixel define layer is strong, while the lyophobicity of the side surface of the opening of the pixel define layer is weak. Therefore, when printing the luminescent material in the opening of the pixel define layer, the ink on the side surface of the opening easily climbs up, which results in non-uniform thickness of the luminescent material formed by printing.

In view of the above, the embodiments of the present disclosure provide the following technical solutions.

FIG. 1 is a schematic structural view showing a pixel define structure according to an embodiment of the present disclosure.

As shown in FIG. 1, the pixel define structure comprises a pixel define layer 102 located on a substrate 101. The thickness of the pixel define layer 102 may be 0.5 micron to 5 microns, for example, 2 microns, 4 microns, or the like.

An electrode 103, such as an anode, may be formed on the substrate 101. Different electrodes 103 may be separated by the pixel define layer 102. It should be understood that a thin film transistor (TFT) array, a capacitor, a resistor, a wiring, a planarization layer or the like (not shown) may also be formed in the substrate 101. The pixel define layer 102 and the electrode 103 are located on the planarization layer.

The pixel define layer 102 may, for example, define an opening 104 that exposes at least a part of an upper surface of the electrode 103. FIG. 1 shows a case where the opening 104 exposes the entire upper surface of the electrode 103. In some cases, the opening 104 may expose a part of the upper surface of the electrode 103. For example, the pixel define layer 102 may cover a part of the upper surface of the electrode 103. In some embodiments, the pixel define layer 102 may be in a shape of mesh, i.e., the pixel define layer 102 defines a plurality of openings 104.

The pixel define layer 102 comprises a stacked multilayer. The stacked multilayer here comprises at least a first layer 112 and a second layer 122, the first layer 112 being located between the substrate 101 and the second layer 122. The mass percent of a lyophobic material in the second layer 122 is greater than a mass percent of the lyophobic material in the first layer 112. In some embodiments, a projection of the second layer 122 on the substrate 101 is within a projection of the first layer 112 on the substrate 101. It should be understood that the material of the pixel define layer 102 may comprise other materials other than the lyophobic material, such as at least one of polyimide (PI) or polymethyl methacrylate (PMMA).

In some embodiments, the stacked multilayer may comprise only the first layer 112 and the second layer 122. In this case, the mass percent of the lyophobic material contained in the relatively upper second layer 122 is greater than the mass percent of the lyophobic material contained in the relatively lower first layer 112.

In other embodiments, the stacked multilayer may comprise other layers other than the first layer 112 and the second layer 122, such as a third layer 132 located between the first layer 112 and the second layer 122, or the like. Here, the mass percent of the lyophobic material in the other layers of the stacked multilayer may be greater or lower than the mass percent of the lyophobic material in the second layer 122, and may be between the mass percent of the lyophobic material in the second layer 122 and the mass percent of the lyophobic material in the first layer 112.

In some embodiments, the lyophobic material may comprise at least one of fluorinated polymeric material or chlorinated polymeric material. The fluorinated polymeric material may comprise, for example, polyvinylidene fluoride (PVDF), or the like. The chlorinated polymeric material may comprise, for example, chlorinated polyethylene, or the like. In one or more embodiments, the lyophobic material may be a material having a hydrophobic group.

In the above embodiments, the mass percent of the lyophobic material of the relatively upper second layer is greater than the mass percent of the lyophobic material of the relatively lower first layer. When the luminescent material is subsequently printed in the opening of the pixel define layer, the solution does not easily climb up from the side surface of the opening, thus the uniformity of the thickness of the luminescent material is improved.

In some embodiments, the mass percent of the lyophobic material contained in each of the stacked multilayer increases gradually in a direction from close to the substrate 101 to away from the substrate 101 (i.e., in a direction from bottom to top). Referring to FIG. 1, taking the stacked multilayer comprising three layers as an example, the mass percent of the lyophobic material in the first layer 112, the third layer 132 and the second layer 122 increases gradually.

In the above embodiments, the mass percent of the lyophobic material of the pixel define layer increases gradually from bottom to top. This makes it more difficult for the solution to climb up from the side surface of the opening when the luminescent material is subsequently printed in the opening of the pixel define layer. The uniformity of the thickness of the luminescent material can be further improved.

In one or more embodiments, the stacked multilayer comprises 3 layers to 6 layers, for example, 4 layers and 5 layers. Such a pixel define layer 102 makes it more difficult for the solution to climb up from the side surface of the opening when the luminescent material is printed in the opening of the pixel define layer 102. The uniformity of the thickness of the luminescent material can be further improved.

Embodiments of the present disclosure provide a display panel, comprising a pixel define structure 300 provided by any of the above embodiments.

In some embodiments, the display panel further comprises a substrate 101 shown in FIG. 1 and an electrode 103 disposed on the substrate 101. The pixel define layer 102 defines an opening 104 that exposes at least a part of the upper surface of the electrode 103.

Figure 2:
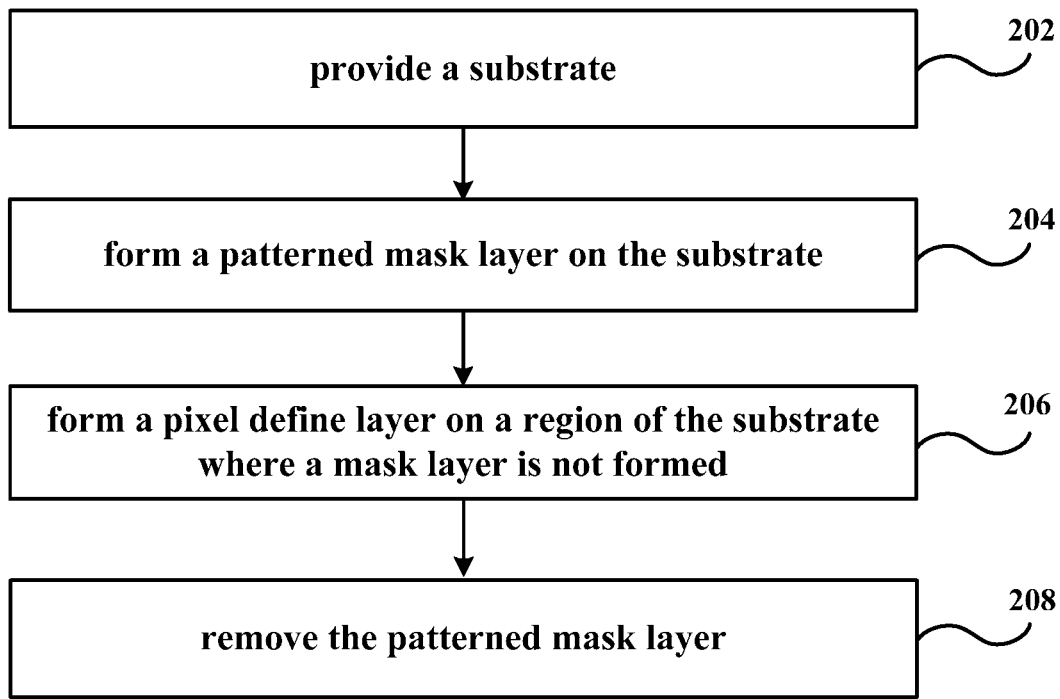
FIG. 2 is a schematic flow chart showing a method for manufacturing a display panel according to an embodiment of the present disclosure.
Figure 3A:
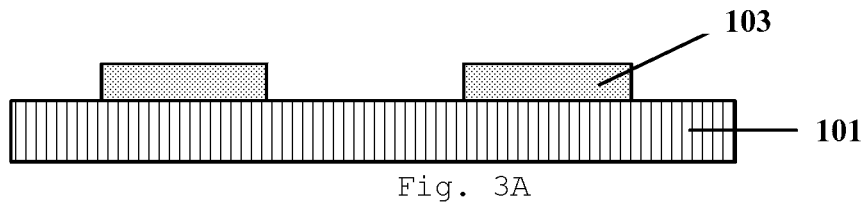
FIGS. 3A-3C are schematic cross-sectional views showing structures of a display panel formed at different stages according to some embodiments of the present disclosure.
Figure 3B:
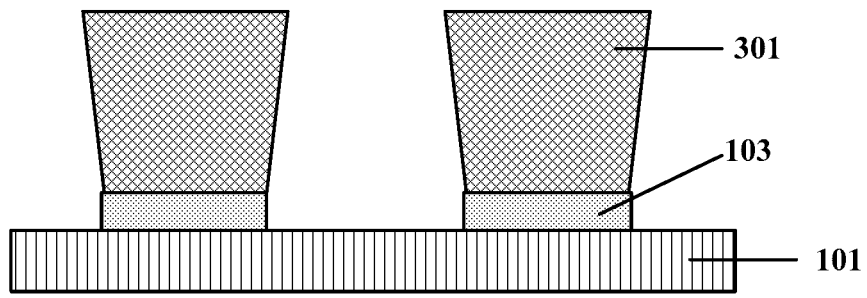
Figure 3C:
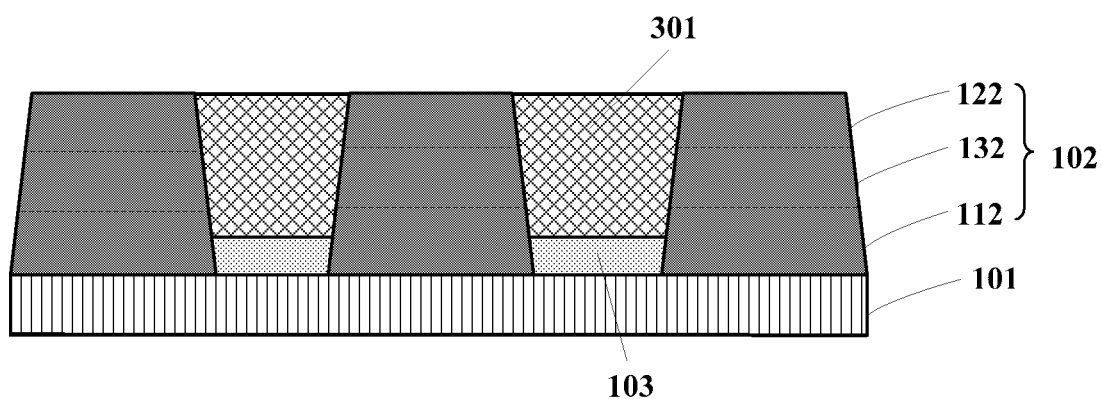

FIG. 2 is a schematic flow chart showing a method for manufacturing a display panel according to an embodiment of the present disclosure. FIGS. 3A-3C are schematic cross-sectional views showing structures of a display panel formed at different stages according to some embodiments of the present disclosure.

The manufacturing process of a display panel will be described in detail below with reference to FIG. 2 and FIG. 3A-3C.

First, at step 202, a substrate 101 is provided, as shown in FIG. 3A.

In some embodiments, after the substrate 101 is provided, an electrode 103 may be formed on the substrate 101. In some embodiments, the material of the electrode 103 may be indium tin oxide (ITO) or a lamination comprising ITO.

Then, at step 204, a patterned mask layer 301 is formed on the substrate 101, as shown in FIG. 3B.

For example, a mask material layer, such as a photoresist layer, may be first coated on the substrate 101. Then, the mask material layer is patterned, for example, exposed and developed to form the patterned mask layer 301. In a case where the electrode 103 is formed on the substrate 101, the patterned mask layer 301 covers at least a part, that is, a part or entire, of the upper surface of the electrode 103. FIG. 3B shows a case where the patterned mask layer 301 covers the entire upper surface of the electrode 103. In some embodiments, the patterned mask layer 301 may have a thickness of 1 micron to 5 microns, for example, 2 microns to 4 microns, for example, 3 microns.

Next, at step 206, a pixel define layer 102 is formed on a region of the substrate 101 where the patterned mask layer 301 is not formed, as shown in FIG. 3C. The pixel define layer 102 comprises a stacked multilayer comprising at least a first layer 112 and a second layer 122, the first layer 112 being located between the substrate 101 and the second layer 122. The mass percent of the lyophobic material in the second layer 122 is greater than the mass percent of the lyophobic material in the first layer 112. For example, the lyophobic material may comprise at least one of fluorinated polymeric material or chlorinated polymeric material.

In some embodiments, the pixel define layer 102 may be formed by an ink jet printing process.

In some implementations, as shown in FIG. 3C, a first solution containing a lyophobic material may be printed on the region of the substrate 101 where the mask layer 301 is not formed to form the first layer 112. Then, a second solution containing the lyophobic material is printed on the first layer 112 to form the second layer 122 above the first layer 112. Here, the mass percent of the lyophobic material in the second solution is greater than the mass percent of the lyophobic material in the first solution, thus the mass percent of the lyophobic material in the formed second layer 122 is greater than the mass percent of the lyophobic material in the first layer 112.

It should be noted that before forming the first layer 112, or between forming the first layer 112 and forming the second layer 122, or after forming the second layer 122, other solutions containing a lyophobic material may also be printed on the region of the substrate 101 where the mask layer 301 is not formed to form other layers such as the third layer 132 shown in FIG. 3C.

In some embodiments, a plurality of solutions having a mass percent of the lyophobic material from low to high may be sequentially printed on the region of the substrate 101 where the mask layer 301 is not formed to form the staked multilayer of the pixel define layer 102. The mass percent of the lyophobic material in each of the staked multilayer gradually increases from bottom to top. Referring to FIG. 3C, for example, the staked multilayer comprises a first layer 112, a third layer 132 and a second layer 122 in order from bottom to top. It should be understood that the staked multilayer may comprise more than three layers, for example, 4 layers, 5 layers or 6 layers.

In some embodiments, the mass ratio of the lyophobic material to the solute material in each of the plurality of solutions used to form the pixel define layer 102 is less than or equal to 1. In some embodiments, the viscosity of the solution may be 1 cP-1000 cP, for example, 10 cP-800 cP, for example, 30 Cp, 400 cP, or the like.

Then, at step 208, the patterned mask layer 301 is removed. After the patterned mask layer 301 is removed, an opening 104 of the pixel define layer 102 is defined (see FIG. 1).

In some embodiments, after the mask layer 301 is removed, a luminescent material, such as an organic luminescent material, may also be printed in the opening of the pixel define layer 102.

Figure 4:
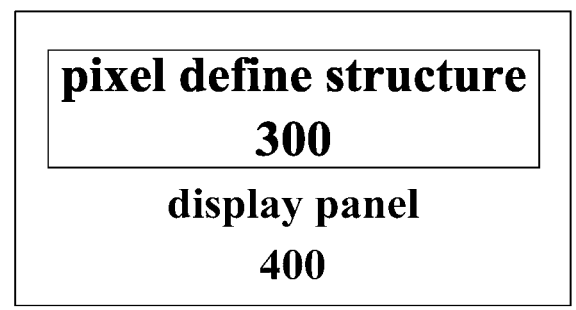
FIG. 4 is a schematic structural view showing a display panel according to an embodiment of the present disclosure.

FIG. 4 is a schematic structural view showing a display panel according to an embodiment of the present disclosure.

As shown in FIG. 4, the display panel 400 may comprise the pixel define structure 300 of any of the above embodiments. As the mass percent of the lyophobic material in the relatively upper second layer of the pixel define layer is greater than the mass percent of the lyophobic material in the relatively lower first layer, the uniformity of the thickness of the luminescent material formed subsequently can be improved, and the display effect of the display panel can be improved.

Figure 5:
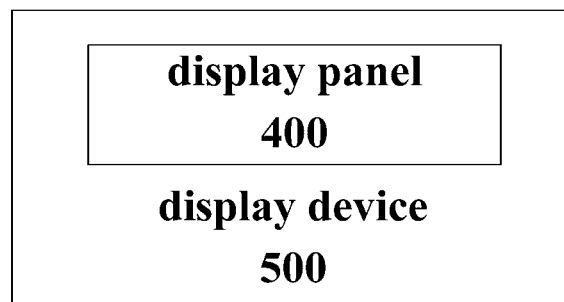
FIG. 5 is a schematic structural view showing a display device according to an embodiment of the present disclosure.

FIG. 5 is a schematic structural view showing a display device according to an embodiment of the present disclosure.

As shown in FIG. 5, the display device 500 may comprise the display panel 400 of any of the above embodiments. In some embodiments, the display device may be any product or component having a display function such as a mobile terminal, television, display, notebook computer, digital photo frame, navigator, or electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A pixel define structure, comprising:
a pixel define layer on a substrate, wherein the pixel define layer comprises a stacked multilayer comprising at least a first layer and a second layer, the first layer being located between the substrate and the second layer,
wherein:
a number of layers of the stacked multilayer is greater than two;
each layer of the stacked multilayer comprises a lyophobic material; and
a mass percent of the lyophobic material in each layer of the stacked multilayer increases gradually in a direction from the substrate to the pixel define layer.

2. The pixel define structure of claim 1, wherein the pixel define layer further comprises at least one of polyimide or polymethyl methacrylate.

3. The pixel define structure of claim 1, wherein the pixel define layer is in a shape of mesh.

4. The pixel define structure of claim 1, wherein a projection of the second layer on the substrate is within a projection of the first layer on the substrate.

5. The pixel define structure of claim 1, wherein the pixel define layer has a thickness ranging from 0.5 micron to 5 microns.

6. The pixel define structure of claim 1, wherein the stacked multilayer comprises 3 layers to 6 layers.

7. The pixel define structure according to claim 1, wherein the lyophobic material comprises at least one of fluorinated polymeric material or chlorinated polymeric material.

8. A display panel, comprising the pixel define structure according to claim 1.

9. The display panel according to claim 8, further comprising:
the substrate; and
an electrode disposed on the substrate, wherein the pixel define layer defines an opening exposing at least a part of an upper surface of the electrode.

10. A display device, comprising the display panel according to claim 8.

11. A method for manufacturing a display panel, comprising:
providing a substrate;
forming a patterned mask layer on the substrate;
forming a pixel define layer on a region of the substrate where the patterned mask layer is not formed, wherein the pixel define layer comprises a stacked multilayer comprising at least a first layer and a second layer, the first layer being located between the substrate and the second layer, wherein a number of layers of the stacked multilayer is greater than two, each layer of the stacked multilayer comprises a lyophobic material, and a mass percent of the lyophobic material in each layer of the stacked multilayer increases gradually in a direction from the substrate to the pixel define layer; and
removing the patterned mask layer.

12. The method according to claim 11, wherein the pixel define layer is formed by an ink jet printing process.

13. The method according to claim 12, wherein forming the pixel define layer by the ink jet printing process comprises:
printing a first solution containing the lyophobic material on the region of the substrate to form the first layer; and
printing a second solution containing the lyophobic material on the first layer to form the second layer, wherein the mass percent of the lyophobic material in the second solution is greater than the mass percent of the lyophobic material in the first solution.

14. The method according to claim 13, wherein forming the pixel define layer by the ink jet printing process comprises:
printing sequentially a plurality of solutions comprising the first solution and the second solution on the region of the substrate to form the stacked multilayer, wherein the earlier one of the plurality of solutions is printed, the lower the mass percent of the lyophobic material in the one of the plurality of solutions is.

15. The method according to claim 14, wherein a mass ratio of the lyophobic material to a solute material in each of the plurality of solutions is less than or equal to 1.

16. The method according to 11, further comprising:
forming, before forming the patterned mask layer, an electrode on the substrate, wherein the patterned mask layer covers at least a part of an upper surface of the electrode.

17. The method according to claim 16, further comprising:
printing, after removing the patterned mask layer, a luminescent material in an opening of the pixel define layer.

18. The method according to claim 11, wherein forming the patterned mask layer on the substrate comprises:
forming a photoresist layer on the substrate; and
exposing and developing the photoresist layer to form the patterned mask layer.

19. A method for manufacturing a display panel, comprising:
providing a substrate;
forming a patterned mask layer on the substrate;
forming a pixel define layer comprising a lyophobic material, by an ink jet printing process, on a region of the substrate where the patterned mask layer is not formed, wherein the pixel define layer comprises a stacked multilayer comprising at least a first layer and a second layer, the first layer being located between the substrate and the second layer, wherein a mass percent of the lyophobic material in the second layer is greater than a mass percent of the lyophobic material in the first layer; and
removing the patterned mask layer,
wherein forming the pixel define layer by the ink jet printing process comprises:
printing a first solution containing the lyophobic material on the region of the substrate to form the first layer; and
printing a second solution containing the lyophobic material on the first layer to form the second layer, wherein the mass percent of the lyophobic material in the second solution is greater than the mass percent of the lyophobic material in the first solution.

20. The method according to claim 19, wherein forming the pixel define layer by the ink jet printing process comprises:
printing sequentially a plurality of solutions comprising the first solution and the second solution on the region of the substrate to form the stacked multilayer, wherein the earlier one of the plurality of solutions is printed, the lower the mass percent of the lyophobic material in the one of the plurality of solutions is.

* * * * *